United States Patent [19]
Narayana et al.

[11] Patent Number: 6,023,435
[45] Date of Patent: *Feb. 8, 2000

[54] STAGGERED BITLINE PRECHARGE SCHEME

[75] Inventors: Pidugu L. Narayana, Santa Clara, Calif.; Daniel E. Cress, Starkville, Miss.; Andrew L. Hawkins, San Jose, Calif.

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,381

[22] Filed: Dec. 22, 1997

[51] Int. Cl.[7] ...................................................... G11C 7/00
[52] U.S. Cl. ........................................... 365/203; 365/233
[58] Field of Search .............................. 365/203, 189.02, 365/230.02, 233, 221

[56] References Cited

U.S. PATENT DOCUMENTS

| | | | |
|---|---|---|---|
| 5,027,326 | 6/1991 | Jones | 365/221 |
| 5,222,047 | 6/1993 | Matsuda et al. | 365/230.03 |
| 5,546,347 | 8/1996 | Ko et al. | 365/221 |
| 5,636,174 | 6/1997 | Rao | 365/203 |
| 5,729,498 | 3/1998 | Yih et al. | 365/203 |
| 5,745,421 | 4/1998 | Pham et al. | 365/203 |

*Primary Examiner*—David Nelms
*Assistant Examiner*—VanThu Nguyen
*Attorney, Agent, or Firm*—Christopher P. Maiorana, P.C.

[57] ABSTRACT

A circuit and method for staggering a bitline precharge between particular sections of a memory array. The present invention may be implemented in memories having increasing depths to reduce unacceptably high precharge current requirements associated with high bitline loads. Since the particular memory sections of the memory array are turned on independently, the peak current necessary to charge the particular bitlines is limited. The present invention may be implemented in logic and may therefore be less sensitive to process and temperature variations.

20 Claims, 5 Drawing Sheets

STAGGERED BITLINE PRECHARGE SCHEME

FIELD OF THE INVENTION

The present invention relates to memories generally and, more particularly, to a circuit and method for staggering the bitline precharge between particular memory sections in a larger memory array.

BACKGROUND OF THE INVENTION

In modern semiconductor manufacturing, large memory arrays are often fabricated by combining a number of smaller memory sections in an effort to economically make the larger array. The bitlines in a particular column of a memory array often require precharging prior to reading and/or writing to the particular cells. Precharging is generally required for memory cells to prevent data disturb issues due to charge sharing. As memory depths increase, the depth of each of the memory sections within the larger memory array also increases. Specifically, the number of cells in a particular column of modern memory devices has become quite large. If each of the smaller sections of a memory array are precharged simultaneously, which was often done in conventional approaches, an excessive amount of current may be drawn. The excessive amount of current is generally undesirable in an integrated circuit seeking to have a low overall heat generation, a high mean time between failures (MTBF), a low noise on power busses, etc.

Referring to FIG. 1, a conventional memory array 10 is shown. The memory array 10 generally comprises a write multiplexor 12, a read multiplexor 14, a memory array 16, a read pointer control block 18 and a write pointer control block 20. The memory array 16 generally comprises a number of bitlines 22a–22n. If a number of the bitlines 22a–22n are charged high at the same time, the precharging may draw an excessive amount of current, particularly in a dense memory array 10.

One way to limit the peak current used when precharging a bitline includes using a current limiting circuit. Additionally, differential sense amplifiers (which require a precharge but don't draw much current) may be implemented that do not discharge the bitlines all the way to the ground or VSS potential. While such a technique may limit the amount of precharge current necessary, it may suffer from the drawbacks of generally requiring more chip area to implement and is generally simulation intensive. A current limiting technique may require both hot and cold testing since the usage of a reference voltage used in the current limiting circuit may vary under such conditions. The requirement for both hot and cold testing generally increases the cost of back-end testing and may slow production.

SUMMARY OF THE INVENTION

The present invention concerns a circuit and method for staggering a bitline precharge between particular sections of a memory array. The present invention may be implemented in memories having increasing depths. Dense memories generally lead to high bitline loads due to long bitline wires which may lead to unacceptably high precharge current requirements. Since the particular memory sections of the memory array are turned on independently, the peak current necessary to charge the particular bitlines may be limited. The present invention may be implemented in logic and may therefore be less sensitive to process and temperature variations, in contrast to a current limiting scheme which may be susceptible to such variations.

The objects, features and advantages of the present invention include providing a circuit and method for staggering the bitline precharge in a FIFO or other memory which limits the peak current necessary for such precharging, particularity in the context of high depth memories.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
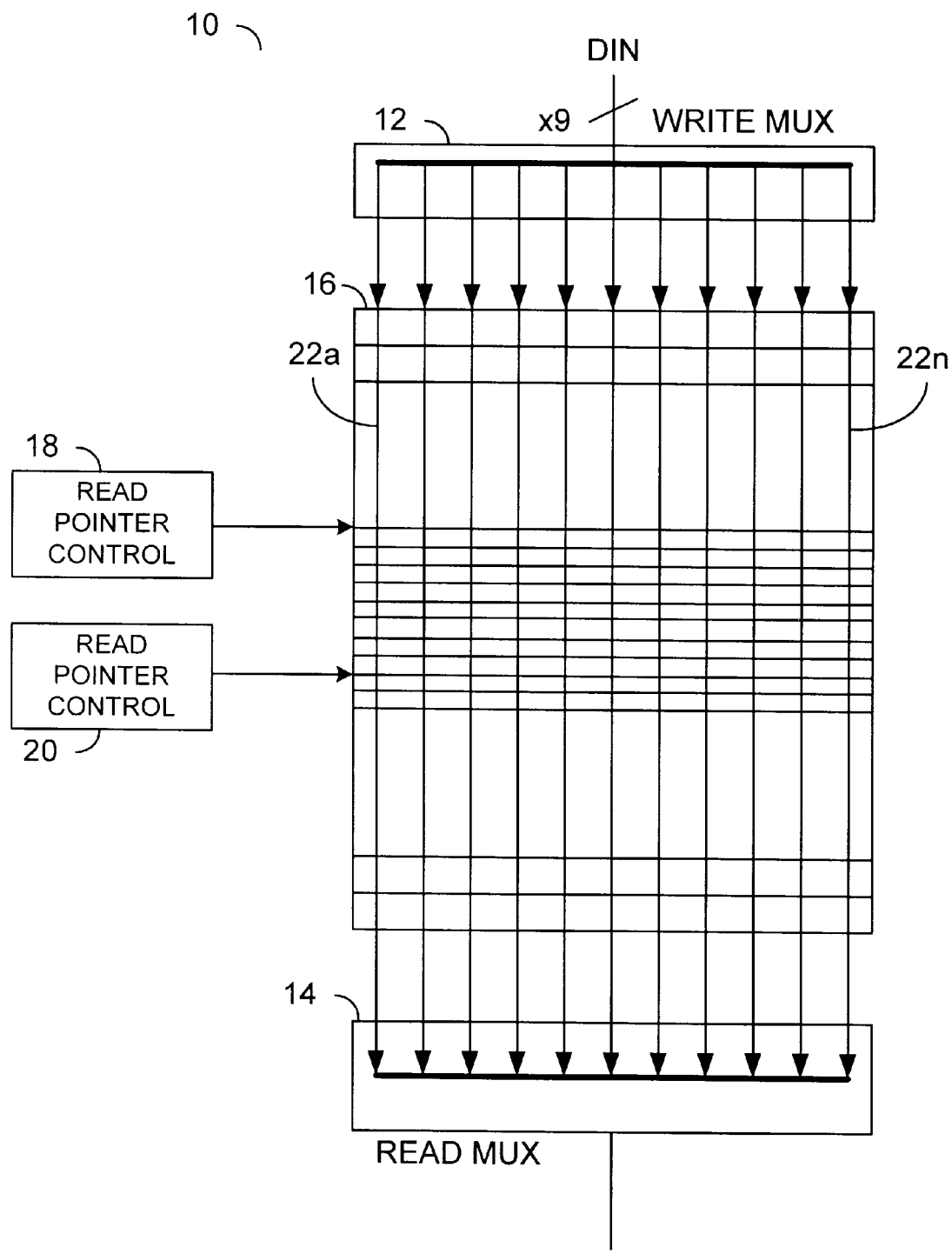
FIG. 1 is a block diagram of a conventional memory array.
Figure 2:
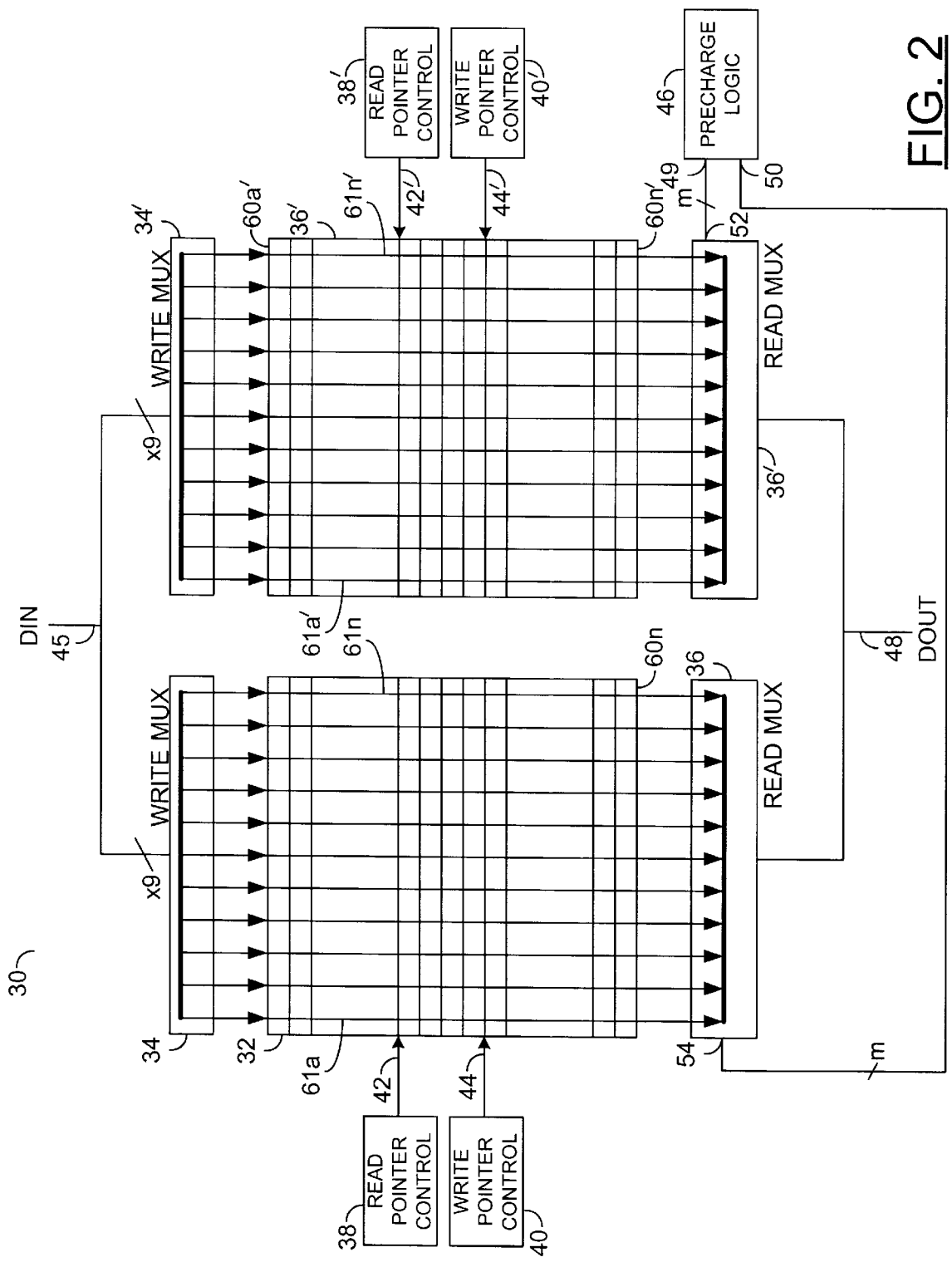
FIG. 2 is a block diagram of a preferred embodiment of the present invention.

Referring to FIG. 2, a diagram of a circuit 30 is shown in accordance with a preferred embodiment of the present invention. The circuit 30 generally comprises a memory section 32, a write multiplexor block (or circuit) 34, a read multiplexor block (or circuit) 36, a read pointer control block (or circuit) 38, a write pointer control block (or circuit) 40, a read pointer 42, a write pointer 44, a data input (e.g., Din) 45, a precharge logic block (or circuit) 46 and a data output (e.g., Dout) 48. A second memory section 32' generally has similar components illustrated with primed referenced numbers. For example, a write multiplexor 34' a read multiplexor 36', a read pointer control 38', a write pointer control 40', a read pointer 42' and a write pointer 44' are shown. The precharge logic block 46 generally has an output 49 that may present a multi-bit signal (e.g., m-bits) and an output 50 that may present a multi-bit signal (e.g., m'-bits). The signals presented at the outputs 49 and 50 generally control the operation of the read multiplexors 36 and 36' (to be described in more detail in connection with FIGS. 3–5).

The signal presented at the output 49 is generally received at an input 52 of the read multiplexor 36' while the signal presented at the output 50 is generally received at an input 54 of the read multiplexor 36. The memory array 32 generally comprises a number of rows 60a–60n that may be activated by the read pointer 42 and the write pointer 44 that generally point to separate wordlines. Similarly, the memory array 32' has a number of rows 60a'–60n' that may also be controlled by the read pointer 42 and the write pointer 44. The memory array 32 also comprises a number of columns (or bitlines) 61a–61a' that may be controlled by the write multiplexor 34 and the read multiplexor 36. Similarly, the memory array 32' generally comprises a number of columns (or bitlines) 61a'–61n' that may be controlled by the write multiplexor 34' and the read multiplexor 36'.

Figure 3:
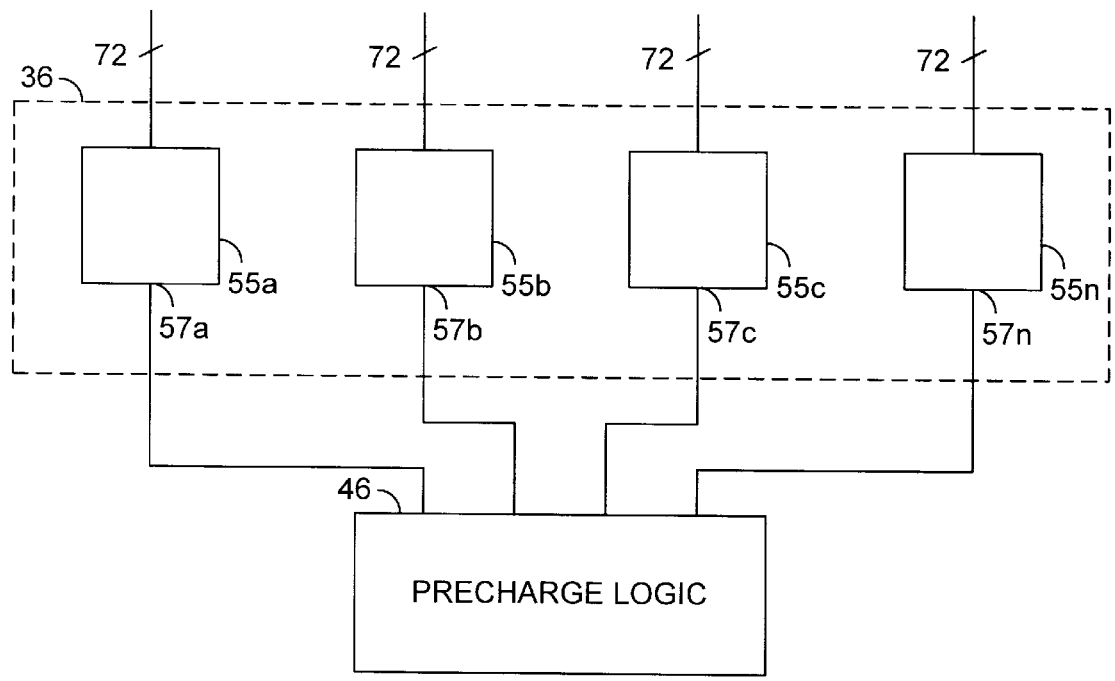
FIG. 3 is a more detailed block diagram of the precharge logic illustrated in conjunction with the read multiplexors.

Referring to FIG. 3, a more detailed block diagram of the read multiplexor block 36 is shown in conjunction with the precharge logic block 46. The read multiplexor 36 generally comprises a number of read multiplexor blocks 55a–55n that may each receive a control signal from the precharge logic block 46 at a number of inputs 57a–57n. In general, only one of the inputs 57a–57n begins to receive an active signal at a given time. The inputs 57a–57n are generally turned on at staggered cycles of the input clock (e.g., RB), but may be turned off simultaneously (to be described in more detail in connection with FIG. 5). As a result, only a certain number of bitlines (or columns) are activated at a given time which generally reduces the peak current consumed by the circuit 30. The example shown in FIG. 3 generally shows each of the read multiplexor sections 55a–55n driving a number of columns. The specific example illustrates the particular read multiplexor sections 55a–55n each controlling 72 individual columns. However, any number of columns may be controlled by each one of the particular read multiplexor sections 55a–55n.

Figure 4:
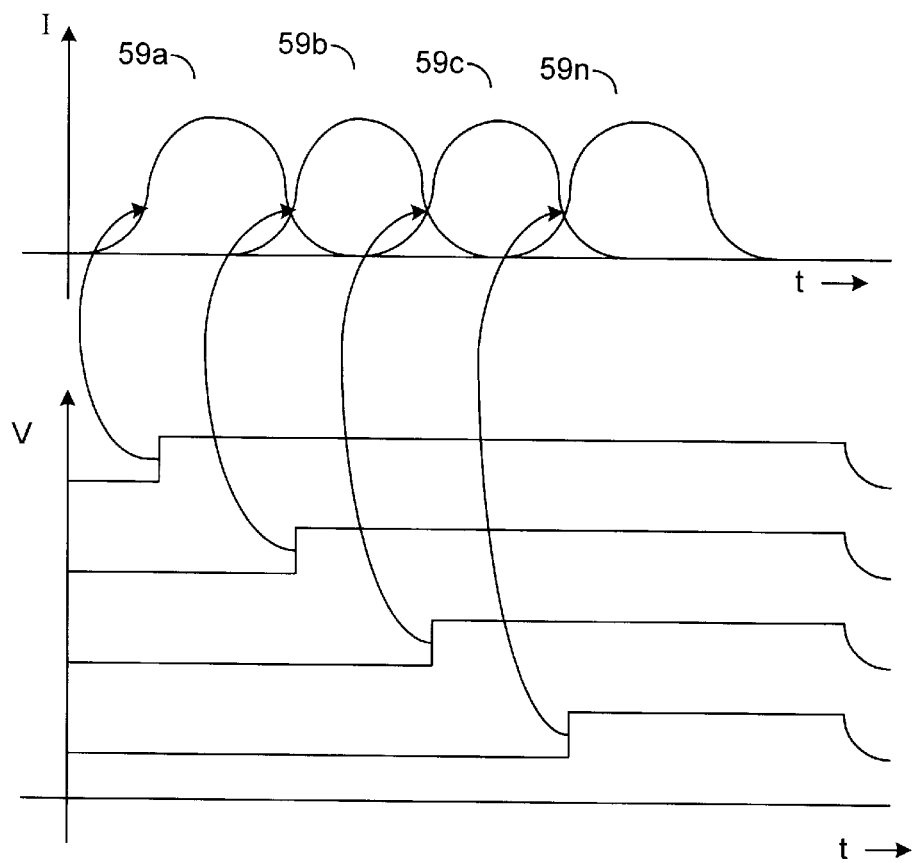
FIG. 4 illustrates a graph of the peak current used to turn on the particular bitlines.

Referring to FIG. 4, a diagram illustrating the particular turn-on currents along with the peak current consumed by the circuit 30 is shown. For example, the waveform 59a may represent the current consumed when the read multiplexor block 55a is turned on, while the waveforms 59b–59n may correspond to the current consumed when the read multiplexors 55b–55n are turned on. Since the current consumption of one of the waveforms 59a–59n generally declines over the period of a cycle as the next waveform begins to precharge, the overall peak consumed by the circuit 30 may be reduced.

Figure 5:
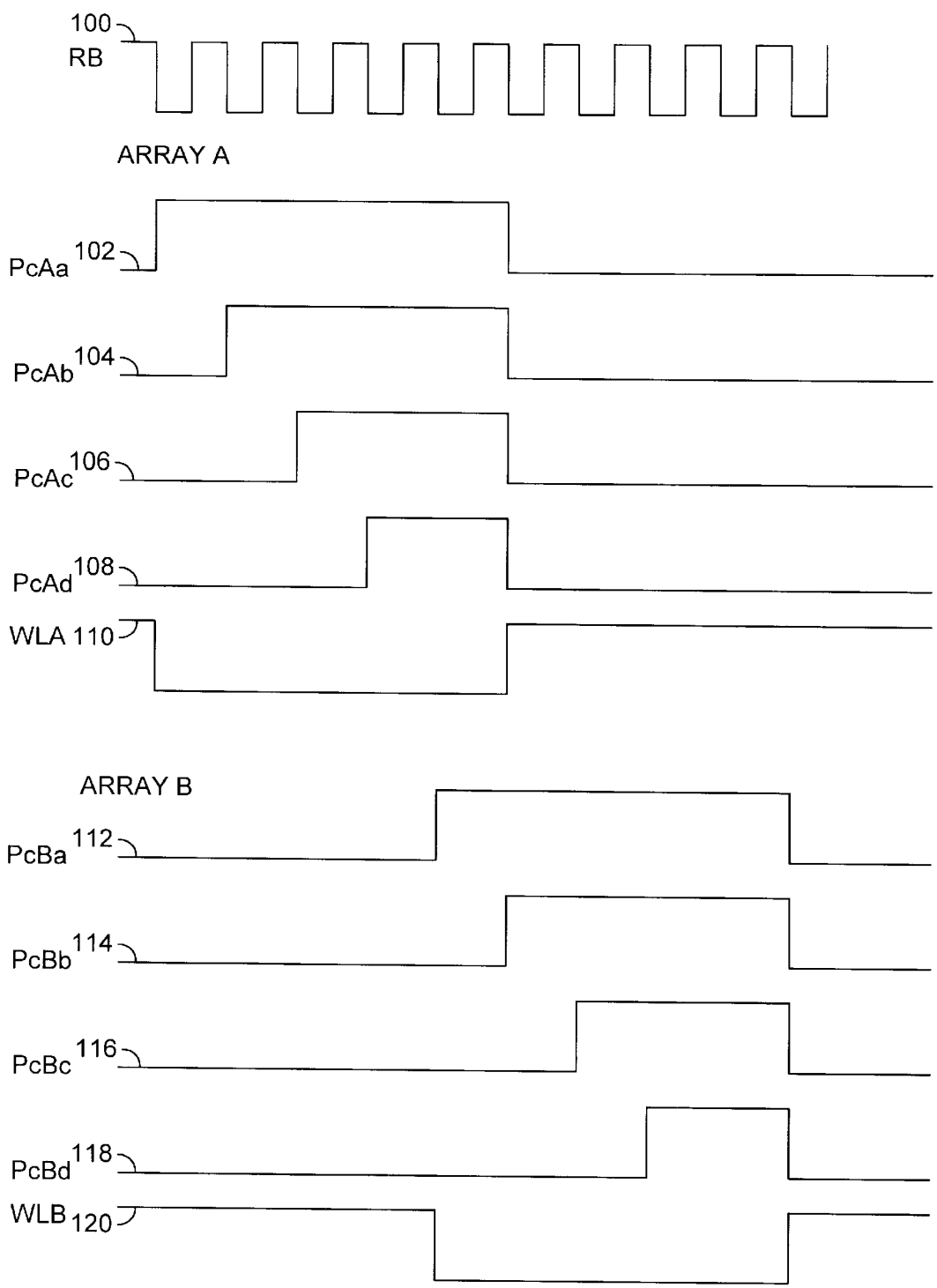
FIG. 5 is a timing diagram of the staggered bitline precharge function in accordance with a preferred embodiment of the present invention.

Referring to FIG. 5, a timing diagram illustrating the staggered precharge function of the circuit 30 is shown. The diagram generally comprises an input clock timing signal 100 (e.g., RB), a signal 102 (e.g., PcAa), a signal 104 (e.g., PcAb), a signal 106 (e.g., PcAc), a signal 108 (e.g., PcAd) and a signal 110 (e.g., wordline enable WLA). The signal 100 may be implemented, in one example, as a periodic signal. The signal PcAa generally corresponds to the turn-on control signal of the read multiplexor 55a, the signal PcAb generally corresponds to the turn-on control signal of the read multiplexor 55b, the signal PcAc generally corresponds to the turn-on control signal of the read multiplexor 55c and the signal PcAd generally corresponds to the turn-on control signal of the read multiplexor 55n.

When the wordline enable signal 110 transitions low, the particular signals 102–108 generally each transition high on the next subsequent falling edge of the signal 100. Initially, the signal 102 generally transitions high. Next, the signal 104 generally transitions high. Then, the signal 106 generally transition high. Finally, the signal 108 generally transitions high. As a result, each of the precharge signals 102–108 turns on in a generally successive manner. The precharging current drawn by each of the signals 102–108 is generally only a design constraint during the initial turn-on time. After the initial turn-on (generally indicated by the positive transition of one of the signals 102–108), the peak current drawn to maintain the particular bitline in a precharged state is greatly reduced. As a result, even though each of the precharge signals 102–108 remains high at the end of the enablement of the signal 110, the maximum current at any given time may be maintained at a minimum.

A waveform 112, a waveform 114, a waveform 116, a waveform 118 and a waveform 120 generally illustrate a similar turn-on of the read multiplexors 55a–55n that may be present in the memory array 32'. In an example of a retransmit, the turn-on currents between the memory array A (e.g., 32) and the memory array B (e.g., 32') are generally coordinated to reduce the peak amount of current consumed. However, in a memory array 32 that does not have separate memory sections, a single turn-on implementation may be implemented in the precharge logic 46.

Figure 6:
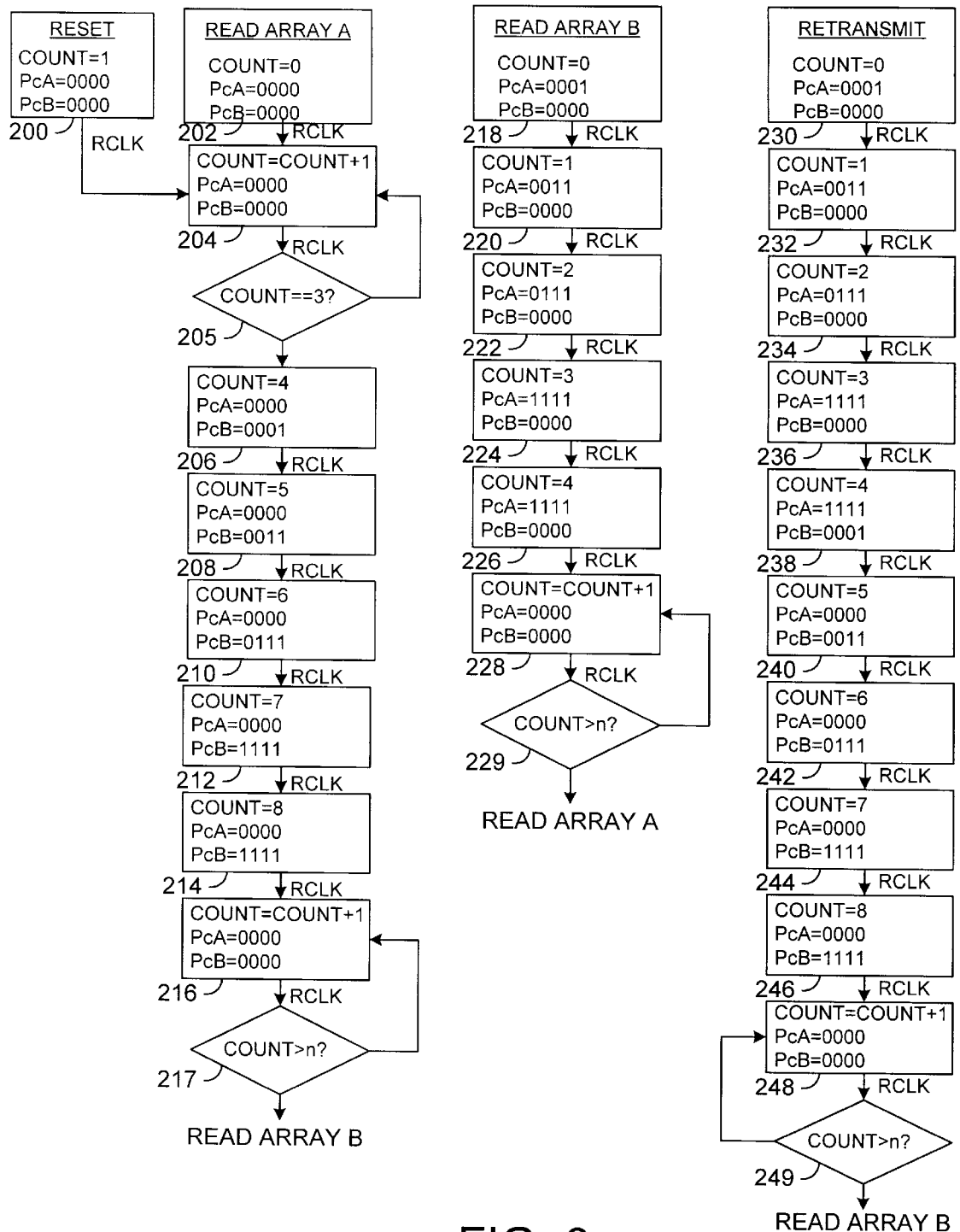
FIG. 6 is a state diagram illustrating an example of the precharge logic.

Referring to FIG. 6, a state diagram illustrating an example of the precharge logic 46 is shown. The precharge logic 48 may be implemented in discrete logic, a programming language (such as verilog hardware description language (HDL) as defined by the IEEE 1364–1995 standard) or any other appropriate implementation. The state diagram generally comprises a reset state 200, a read array A state 202, a state 204, a state 206, a state 208, a state 210, a state 212, a state 214, a state 216, a read array B state 218, a state 220, a state 222, a state 224, a state 226, and a state 228. Additionally, the state diagram may comprise a retransmit portion that may comprise a retransmit state 230, a state 232, a state 234, a state 236, a state 238, a state 240, a state 242, a state 244, a state 246 and a state 248.

Each of the states 200–248 generally show the configuration of the signals presented from the retransmit logic block 48. A first group of signals may be represented by a four bit signal PcA, where each bit generally represents one of the control signals presented to the read multiplexors 55a–55n. For example, in state 200, the signal PcA is shown as a 4-bit value 0000 and the signal PcB is shown as a 4-bit value 0000, where each of the bits generally indicates that each of the inputs to the read multiplexors 54 and 54a are in a deactivated state (e.g, a logic low state) and precharging has not yet occurred. While in the state 202, a internal counter is generally equal to zero. After a reset condition occurs at the state 200, the logic enters the state 204 on the read clock where the internal count value is generally incremented. A logic block 205 generally checks the value of the internal count signal on a transition (either positive or negative) of the read clock RB. If the value is equal to a predetermined value (e.g., 3, which may be a value equal to the precharge offset of the memory array 32'), the logic enters the state 206. If the count is not equal to a predetermined value (e.g., 3), the logic generally returns to the state 204. If the count is equal to the predetermined value, the signal PcB is shown to change to a value 0001, which generally indicates that the first read multiplexor 55a is turned on. The logic generally enters a new state on each transition (either positive or negative) of the read clock RB. For example, the logic enters from the state 208, then the state 210, then the state 212, then the state 214 and then the state 216.

In each of the states 206–212, the signal PcB turns on an additional read multiplexor 55a–55n to begin precharging as shown by the progression 0011, 0111 and 1111. At the state 214, the signal PcB remains at 1111. At the state 216, the signal PcB is generally equal to 0000, and all precharging is turned off. After exiting the state 216, the counter is generally incremented and a decision block 217 may determine if the count is greater than n, where n is generally equal to the number of words in a row. If the count is greater than n, data is then read from the read array B. If the count is not greater than n, the logic enters the state 216. A similar progression occurs between the states 218, 220, 222, 224, 226 and 228, where the count is generally incremented in each of the states 218–228 and one of the values of the signal PcA is changed, for example, from 0001, to 0011, to 0111, to 1111. With each (positive/negative) transition of the read clock, an additional section may be precharged. At the state 228, all precharge lines are turned off, which generally relates to the example in FIG. 5 where the waveforms 110 and 120 are each in a not enabled state. After the state 228, a decision block 229 determines if the count is greater than n. If the count is greater than n, the data may be read from the array A. If the count is not greater than n, the logic enters to the state 228.

During a retransmit condition, the signals PcA and PcB (in the states 230–238) may incrementally precharge the array A. Data is not generally read from the array during this precharge, but may be read from a retransmit cache (not shown). After the data from the retransmit cache has been read, data may be read from the array A, while the array B is generally precharging. An example of a retransmit memory cache may be found in co-pending application U.S. Ser. No. 08/991,845, (Attorney Docket Number 0325.00134) filed on Dec. 16, 1997, which is hereby incorporated by reference in its entirety. The states 230–248 generally progress to a new count value on each cycle of the read clock RB. The state 240 generally corresponds to the state 208 (during a retransmit condition) where data is generally read from the Array A. In each of the states 230–248, the appropriate control signals are shown. After exiting the state 248, a decision block 249 generally determines if the count value is greater than n. If the count is greater than n, the memory array may read from the array B. If the count is not greater than n, the logic returns to the state 248 where the counter is again incremented. As a result, proper functioning of the array during a retransmit condition is maintained.

While the invention has been particularly shown and described with reference to the preferred embodiments thereof, it will be understood by those skilled in the art that various changes in form and details may be made without departing from the spirit and scope of the invention. For example, the present invention may be implemented in conjunction with writing to a memory array by providing similar control signals to the write multiplexors 34 and 34'.

What is claimed is:

1. A circuit comprising:

a memory array having a plurality of columns configured in one or more groups of columns, wherein the number of columns in each of said groups is less than the number of columns in said plurality of columns;

one or more control circuits each configured to precharge one of said groups of columns in response to one of a plurality of control signals, wherein one of said groups of columns is precharged at a given time; and a logic circuit configured to generate said one of said plurality of control signals on a transition during each period of a periodic input clock.

2. The circuit according to claim 1, wherein said control circuits comprise multiplexors.

3. The circuit according to claim 1, wherein said memory array comprises a first memory section and a second memory section.

4. The circuit according to claim 1, wherein one of said groups of columns in either said first or said second memory section is precharged at a given time.

5. The circuit according to claim 1, further comprising a read clock having a number of cycles, wherein said precharging each of said one or more groups of columns occurs on a separate cycle of said read clock.

6. The circuit according to claim 1, wherein said logic circuit further comprises retransmit logic configured to precharge said plurality of columns during a retransmit condition.

7. A circuit comprising:

memory means having a plurality of columns configured in one or more groups of columns, wherein the number of columns in each of said groups is less than the number of columns in said plurality of columns;

means for precharging a group of said columns in response to one of a plurality of control signals, wherein one of said groups of columns is precharged at a given time; and means for generating one of said plurality of control signals on a transition during each period of a periodic input clock.

8. A method for staggering the precharging of a plurality of columns configured in one or more groups of columns, wherein the number of columns in each of said groups is less than the number of columns in said plurality of columns, comprising the steps of:

(a) generating a system input clock;

(b) generating one of a plurality of control signals on a transition during each period of said system periodic input clock; and (c) precharging a first group of said columns in response to one of said control signals;

(d) repeating step (c) for precharging a subsequent group of said columns during the next subsequent transition during the next period of said system periodic input clock.

9. The method according to claim 8, wherein step (c) provides enabling of said first group of columns during a positive transition of said system periodic input clock.

10. The method according to claim 8, wherein step (c) provides enabling of said first group of columns during a negative transition of said system periodic input clock.

11. The method according to claim 8, wherein each of said columns remain precharged until a subsequent transition of an enable signal.

12. The method according to claim 8, wherein step (d) enables said subsequent group of columns during a negative transition of said system periodic input clock.

13. The method according to claim 8, wherein step (d) enables said subsequent group of columns during a positive transition of said system periodic input clock.

14. The circuit according to claim 1, wherein said memory array comprises a FIFO buffer.

15. The method according to claim 8, wherein said plurality of columns are implemented in a memory array.

16. The circuit according to claim 1, wherein the number of columns in said group is N/2, where N is the number of columns in the memory array.

17. The circuit according to claim 1, wherein the number of columns in said group is N/4, where N is the number of columns in the memory array.

18. The circuit according to claim 1, wherein the number of columns in said group is between 1 and 72.

19. The circuit according to claim 1, wherein one of said plurality of control signals is generated on each positive transition of said input clock.

20. The circuit according to claim 1, wherein one of said plurality of control signals is generated on each negative transition of said input clock.

* * * * *